United States Patent
Ni et al.

(10) Patent No.: US 8,409,702 B2
(45) Date of Patent: Apr. 2, 2013

(54) CUBIC ALUMINUM TITANIUM NITRIDE COATING AND METHOD OF MAKING SAME

(75) Inventors: Wangyang Ni, Ridgewood, NJ (US); Zhigang Ban, Latrobe, PA (US); Ronald M. Penich, Greensburg, PA (US); Yixiong Liu, Greensburg, PA (US)

(73) Assignee: Kennametal Inc., Latrobe, PA (US)

( * ) Notice: Subject to any disclaimer, the term of this patent is extended or adjusted under 35 U.S.C. 154(b) by 0 days.

(21) Appl. No.: 13/021,878

(22) Filed: Feb. 7, 2011

(65) Prior Publication Data

US 2012/0201615 A1  Aug. 9, 2012

(51) Int. Cl.
*B32B 9/00* (2006.01)

(52) U.S. Cl. ............ 428/325; 51/307; 51/309; 428/336; 428/697; 428/698; 428/699

(58) Field of Classification Search .................. 51/307, 51/309; 428/697, 698, 699, 325, 336
See application file for complete search history.

(56) References Cited

U.S. PATENT DOCUMENTS

| | | | |
|---|---|---|---|
| 5,296,016 A | 3/1994 | Yoshimura et al. | |
| 5,712,030 A | 1/1998 | Goto et al. | |
| 6,033,734 A | 3/2000 | Muenz et al. | |
| 6,071,560 A | 6/2000 | Braendle et al. | |
| 6,077,596 A | 6/2000 | Hashimoto et al. | |
| 6,110,571 A | 8/2000 | Yaginuma et al. | |
| 6,250,855 B1 | 6/2001 | Persson et al. | |
| 6,274,249 B1 | 8/2001 | Braendle et al. | |
| 6,333,099 B1 | 12/2001 | Strondl et al. | |
| 6,395,379 B1 | 5/2002 | Braendle | |
| 6,558,749 B2 | 5/2003 | Braendle | |
| 6,565,957 B2 | 5/2003 | Nakamura et al. | |
| 6,599,062 B1 | 7/2003 | Oles et al. | |

(Continued)

FOREIGN PATENT DOCUMENTS

CN 1276024 A 12/2000
EP 0492059 B1 7/2000

(Continued)

OTHER PUBLICATIONS

Weber et al "Cathodic arc evaporation of (Ti,Al)N coatings and (Ti,Al)N/TiN multilayer-caotings-correlation between lifetime pf coated cutting tool, structural and mechanical fiIn properties" Surface & Coatings Tech. 177-178, (2004) p. 227-232.*

(Continued)

*Primary Examiner* — Archene Turner
(74) *Attorney, Agent, or Firm* — Matthew W. Gordon, Esq.

(57) ABSTRACT

Coated cutting tools are disclosed which have a hard coating that includes at least one aluminum titanium nitride layer having a single phase structure of B1 cubic phase and a composition of $(Al_xTi_{1-x})N$, where x is in the range of about 0.46 to about 0.52 moles. The hard coatings also have a residual stress in the range of from about −0.4 to about −3 GPa as measured by the XRD $Sin^2 \Psi$ method, and a crystallographic orientation characterized by an x-ray diffraction (200) to (111) peak intensity ratio in the range of about 1 to about 14. Preferably the aluminum titanium nitride layer has an average crystallite size in the range of about 15 to about 50 nanometers. Methods of making such coated cutting tools are also disclosed.

20 Claims, 2 Drawing Sheets

U.S. PATENT DOCUMENTS

| | | | |
|---|---|---|---|
| 6,669,747 | B2 | 12/2003 | Salmon |
| 6,688,817 | B2 | 2/2004 | Borschert et al. |
| 6,737,178 | B2 | 5/2004 | Ota et al. |
| 6,811,581 | B2 | 11/2004 | Yamada et al. |
| 6,838,151 | B2 | 1/2005 | Kato |
| 6,844,069 | B2 | 1/2005 | Braendle et al. |
| 6,866,921 | B2 | 3/2005 | Grab et al. |
| 6,924,454 | B2 | 8/2005 | Massa et al. |
| 7,018,726 | B2 | 3/2006 | Usami et al. |
| 7,094,479 | B2 | 8/2006 | Sato et al. |
| 7,150,925 | B2 * | 12/2006 | Sato et al. ............... 51/307 |
| 7,169,485 | B2 | 1/2007 | Kohara et al. |
| 7,188,463 | B2 | 3/2007 | Schuller et al. |
| 7,431,988 | B2 | 10/2008 | Hanyu et al. |
| 7,524,569 | B2 * | 4/2009 | Okamura et al. ............ 428/325 |
| 7,767,319 | B2 | 8/2010 | Åkesson et al. |
| 7,838,132 | B2 * | 11/2010 | Ahlgren et al. ............... 428/698 |
| 8,025,956 | B2 | 9/2011 | Yamamoto et al. |
| 8,034,438 | B2 * | 10/2011 | Sundstrom et al. .......... 428/699 |
| 8,084,148 | B2 * | 12/2011 | Larsson et al. ............... 428/697 |
| 2006/0154051 | A1 | 7/2006 | Ahlgren |
| 2006/0219325 | A1 | 10/2006 | Kohara |
| 2006/0257562 | A1 | 11/2006 | Tamagaki et al. |
| 2007/0059558 | A1 | 3/2007 | Schier |
| 2007/0148496 | A1 | 6/2007 | Takaoka et al. |
| 2007/0292671 | A1 | 12/2007 | Akesson et al. |
| 2008/0286608 | A1 | 11/2008 | Quinto et al. |
| 2008/0299383 | A1 | 12/2008 | Martensson et al. |
| 2009/0075114 | A1 | 3/2009 | Hovsepian et al. |
| 2009/0098372 | A1 | 4/2009 | Ishii et al. |
| 2011/0020079 | A1 | 1/2011 | Tabersky et al. |
| 2011/0081539 | A1 | 4/2011 | Ni |

FOREIGN PATENT DOCUMENTS

| | | | |
|---|---|---|---|
| EP | 0558061 | B1 | 8/2000 |
| EP | 0801144 | B1 | 5/2001 |
| EP | 0709353 | B1 | 6/2002 |
| EP | 0885984 | B1 | 7/2002 |
| EP | 1017870 | B1 | 10/2002 |
| EP | 1021584 | B1 | 11/2003 |
| EP | 1087026 | B1 | 11/2003 |
| EP | 1038989 | B1 | 6/2004 |
| EP | 1122226 | B1 | 3/2006 |
| EP | 1683875 | A2 | 7/2006 |
| EP | 1099003 | B1 | 9/2006 |
| EP | 1674597 | B1 | 1/2008 |
| JP | 08-209333 | | 8/1996 |
| JP | 09-300106 | * | 11/1997 |
| JP | 2001-234328 | * | 8/2001 |
| JP | 2002-003284 | * | 1/2002 |
| JP | 2002187004 | A | 7/2002 |
| JP | 2003-127003 | * | 5/2003 |
| JP | 2003-136302 | * | 5/2003 |
| JP | 2007229919 | A | 9/2007 |
| WO | 2005111257 | A2 | 11/2005 |
| WO | 2008037556 | A2 | 4/2008 |
| WO | 2009031958 | A1 | 3/2009 |
| WO | 2009127344 | A1 | 10/2009 |

OTHER PUBLICATIONS

Paldey et al., "Single layer and Multilayer Wear Resistant Coatings of (Ti, Al)N-. A Review," Mat. Sci. Engineer., A342 (2003) 58-79.

Musil et al., "Superhard Nanocomposite Ti1-xAlxN Films Prepared by Magnetron Sputtering," Thin Solid Films 365 (2000) 104-109.

Horling et al., "Mechanical Properties and Machining Performance of TiAlN-Coated Cutting Tools," Surface & Coatings Tech. 191 (2005) 384-392.

Hakansson et al., "Microstructure and Phys. Prop. of Polycrystalline Metastable TiO.5Al0.5N alloys Grown by D.C. Magnetron Sputter Dep.," Thin Solid Films 191 (1987) 55-65.

Huang et al., "Dep. of (Ti,Al)N films on A2 Tool Steel by Reactive R.F. Magnetron Sputtering," Surface and Coatings Tech. 71 (1995) 259-266.

Arndt et al., "Performance of New AlTiN Coatings in Dry and High Speed Cutting," Surface and Coatings Tech. 163-164 (2003) 674-680.

Cremer et al., "Optimization of (Ti,Al)N Hard Coat. By a combinatorial Appr." Int. J. Inorganic Mat. 3 (2001) 1181-1184.

Suzuki et al., "Microstructure of Grain Boundaries of (Ti,Al)N Films," Surface and Coatings Tech. 107 (1998) 41-47.

Endrino et al., "Hard AlTiN, AlCrN PVD Coatings for Machining of Austenitic Stainless Steel," Surface and Coatings Tech. 200 (1986) 6840-6845.

Munz, "Titanium Aluminum Nitride Films: A New Alternative to TiN Coatings," J. Vacuum Sci. Tech. A 4(6) (1986) 2717-2725.

Zhou et al., "Phase Transition and Properties of Ti-Al-N Thin Films Prepared by R.F.-plasma Assisted Magnetron Sputtering," Thin Solid Films 339 (1999) 203-208.

Tanaka et al., "Properties of (Ti1-xAlx)N coatings for Cuffing Tools Prepared by the Cathodic Arc Ion Plating Method," J. Vacuum Sci. Tech. A 10(4) (1992) 1749-1756.

Horling et al., "THermal Stability of Arc Evaporated High Aluminum-Content Ti1-xAlxN Thin Films," J. Vacuum Sci. Tech. A 20(5) (2002) 1815-1823.

Ikeda et al., "Phase Formation and Characterization of Hard Coatings in the Ti-Al-N System Prepared by the Cathodic Arc Ion Plating Method," Thin Solid Films 195 (1991) 99-110.

Kimura et al., "Metastable (Ti1-xAlx)N Films with Different Al Content," J.Mat. Sci. Letters 19 (2000) 601-602.

Cremer et al., "Exp- Determination of Metastable (Ti, Al)N Phase Diagram up to 700C," Val. Addition Metallurgy, Cho & Sohn, Editors, The Min. Metals, & Mat. Soc (1998) 249-258.

Derflinger et al., Mechanical and structural properties of various alloyed TiAlN-based hard coatings, Surface Coatings & Technology, 2006, pp. 4693-4700, vol. 200, Elsevier B.V.

Bobzin et al., Grain size evaluation of pulsed TiAlN nanocomposite coatings for cutting tools, Thin Solid Films, 2007, pp. 3681-3684, vol. 515, Elsevier B.V.

G. Abadias, Stress and preferred orientation in nitride-based PVD coatings, Surface Coatings & Technology, 2008, pp. 2223-2235, vol. 202, Elsevier B.V.

M. Ahlgren et al., Influence of bias variation on residual stress and texture in TiAlN PVD Coatings, Surface Coatings & Technology, 2005, pp. 157-160, vol. 200, Elsevier B.V.

Rauch et al., Structure and composition of TixAl1-xN thin films sputter deposited using a composite metallic target, Surface Coatings & Technology, 2002, pp. 138-143, vol. 157, Elsevier Science B.V.

Search Report for GB1202134.1 dated May 31, 2012; 2 pgs.

* cited by examiner

CUBIC ALUMINUM TITANIUM NITRIDE COATING AND METHOD OF MAKING SAME

FIELD OF THE INVENTION

The invention relates to cutting tools having hard coatings comprising aluminum titanium nitride and methods of making such coated cutting tools. More specifically, the invention relates to coated cutting tools having hard coatings comprising aluminum titanium nitride having a single phase structure of B1 cubic phase and compositions of $(Al_xTi_{1-x})N$, where x is in the range of about 0.46 to about 0.52 moles.

BACKGROUND OF THE INVENTION

It is well-known to use hard coatings comprising aluminum titanium nitride to improve the performance of cutting tools. Development of such hard coatings began in the 1980's and continues today. Some of the developments are taught in the following patents and published patent applications: U.S. Pat. Nos. 7,431,988 B2; 7,188,463 B2; 7,169,485 B2; 7,094,479 B2; 7,018,726 B2; 6,924,454 B2; 6,866,921 B2; 6,844,069 B2; 6,838,151 B2; 6,811,581 B2; 6,737,178 B2; 6,688,817 B2; 6,669,747 B2; 6,599,062 B1; 6,558,749 B2; 6,565,957 B2; 6,395,379 B1; 6,333,099 B1; 6,274,249 B1; 6,250,855 B1; 6,110,571; 6,071,560; 6,033,734; 5,712,030; 5,296,016; European patent nos. EP 1 762 637 B1; EP 1 674 597 B1; EP 1 260 611 B1; EP 1 150 792 B1; EP 1 122 226 B1; EP 1 021 584 B1; EP 1 099 003 B1; EP1 087 026 B1; EP 1 038 989 B1; EP 1 017 870 B1; EP 0 925 386 B1; EP 0 801 144 B1; EP 0 798 399 B1; EP 0 709 353 B1; EP 0 558 061 B1; EP 0 492 059 B1;U.S. published patent application nos. US 2009/0098372 A1; US 2009/0075114 A1; US 2008/0299383 A1; US 2008/02896608 A1; US 2007/0148496 A1; US 2007/0059558 A1; US 2006/0257562 A1; US 2006/0219325 A1; US 2006/0154051 A1; published European patent application nos. EP 2 017 366 A1; EP 2 008 743 A1; EP 2 000 236 A1; EP 1 801 260 A1; EP 1 683 875 A2; EP 1 616 978 A1; EP 1 616 974 A1; EP 1 470 879 A8; published PCT patent applications WO 2009/031958 A1, and WO 2008/037556 A2; and U.S. patent application Ser. No. 12/572,858, which is currently pending and has common ownership with the instant application. Additionally, the development of such hard coatings have been the topic of many technical papers, e.g., S. PalDey et al. "Single Layer and Multilayer Wear Resistant Coatings of (Ti,Al)N: A Review," Materials Science and Engineering A342 (2003) 58-79; J. Musil et al. "Superhard Nanocomposite $Ti_{1-x}Al_xN$ Films Prepared by Magnetron Sputtering," Thin Solid Films 365 (2000) 104-109; A. Horling et al. "Mechanical Properties and Machining Performance of $Ti_{1-x}Al_xN$-Coated Cutting Tools," Surface & Coatings Technology 191(2005) 384-392; G. Häkansson et al. "Microstructure and Physical Properties of Polycrystalline Metastable $Ti_{0.5}Al_{0.5}N$ Alloys Grown by D.C. Magnetron Sputter Deposition," Thin Solid Films 191(1987) 55-65; C.-T. Huang et al. "Deposition of (Ti,Al)N films on A2 Tool Steel by Reactive R.F. Magnetron Sputtering," Surface and Coatings Techology 71 (1995) 259-266; M. Arndt et al. "Performance of New AlTiN Coatings in Dry and High Speed Cutting," Surface Coatings Technology 163-164 (2003) 674-680; R. Cremer et al. "Optimization of (Ti,Al)N Hard Coatings by a Combinatorial Approach," International Journal of Inorganic Materials 3 (2001) 1181-1184; T. Suzuki et al. "Microstructures and Grain Boundaries of (Ti,Al)N Films," Surface Coatings Technology 107 (1998) 41-47; J. L. Endrino et al. "Hard AlTiN, AlCrN PVD Coatings for Machining of Austenitic Stainless Steel," Surface Coatings Technology 200 (2006) 6840-6845; W.-D. Münz "Titanium Aluminum Nitride Films: A New Alternative to TiN Coatings," J. Vacuum Science Technology A 4(6) (1986) 2717-2725; M. Zhou et al. "Phase Transition and Properties of Ti—Al—N Thin Films Prepared by R.F.-Plasma Assisted Magnetron Sputtering," Thin Solid Films 339 (1999) 203-208; Y. Tanaka et al. "Properties of $(Ti_{1-x}Al_x)N$ Coatings for Cutting Tools Prepared by the Cathodic Arc Ion Plating Method," J. Vacuum Science Technology A 10(4) (1992) 1749-1756; A. Horling et al. "Thermal Stability of Arch Evaporated High Aluminum-Content Ti—Al—N Thin Films," J. Vacuum Science Technology A 20(5) (2002) 1815-1823; T. Ikeda et al. "Phase Formation and Characterization of Hard Coatings in the Ti—Al—N System Prepared by the Cathodic Arc Ion Plating Method," Thin Solid Films 195 (1991) 99-110; and A. Kimura et al. "Metastable $(Ti_{1-x}Al_x)N$ Films with Different Al Content," J. of Material Science Letters 19 (2000) 601-602.

Despite the crowdedness of this art, the need for improved machining properties continues to drive development efforts. Unfortunately, the teachings of the prior art are sometimes confusing and contradictory with regard to the properties of titanium aluminum nitride coatings. It is likely that at least some of the discrepancies are due to the sensitivity of the properties of aluminum titanium nitride coatings to the exact conditions and parameters used for depositing the hard coatings, the substrates upon which they are deposited, and the conditions and techniques used for measuring the properties. A consequence of the great number of possible conditions and parameter combinations is that it is very difficult to predict what the hard coating properties of a coated cutting tool will be for a particular aluminum titanium nitride coating composition.

SUMMARY OF THE INVENTION

In one aspect of the present invention, there are provided coated cutting tools having a hard coating comprising at least one aluminum titanium nitride layer having a single phase structure of B1 cubic phase and a composition of $(Al_xTi_{1-x})N$, where x is in the range of about 0.46 to about 0.52 moles, the hard coating having a residual stress in the range of from about −0.4 to about −3 gigaPascals (GPa) as measured by the XRD $Sin^2 \Psi$ method, and a crystallographic orientation characterized by an x-ray diffraction (200) to (111) peak intensity ratio in the range of from about 1 to about 14. Preferably the aluminum titanium nitride layer has an average crystallite size in the range of about 15 to about 50 nanometers. The overall thickness of the hard coating is preferably in the range of about 1 to about 10 microns. Preferably, the hard coatings comprise more than one such aluminum titanium nitride layers. Preferably, the substrate is cemented tungsten carbide. Also preferably, the substrate is configured in the form of an end mill, a milling tool, a turning tool, or a drilling tool.

In another aspect of the present invention, there is provided a method for making such coated cutting tools. Preferred embodiments of such methods include depositing a bonding layer to the substrate, followed by a transitional layer, and the aluminum titanium nitride layers.

BRIEF DESCRIPTION OF THE DRAWINGS

The criticality of the features and merits of the present invention will be better understood by reference to the attached drawings. It is to be understood, however, that the drawings are designed for the purpose of illustration only and not as a definition of the limits of the present invention.

DESCRIPTION OF PREFERRED EMBODIMENTS

Figure 1:
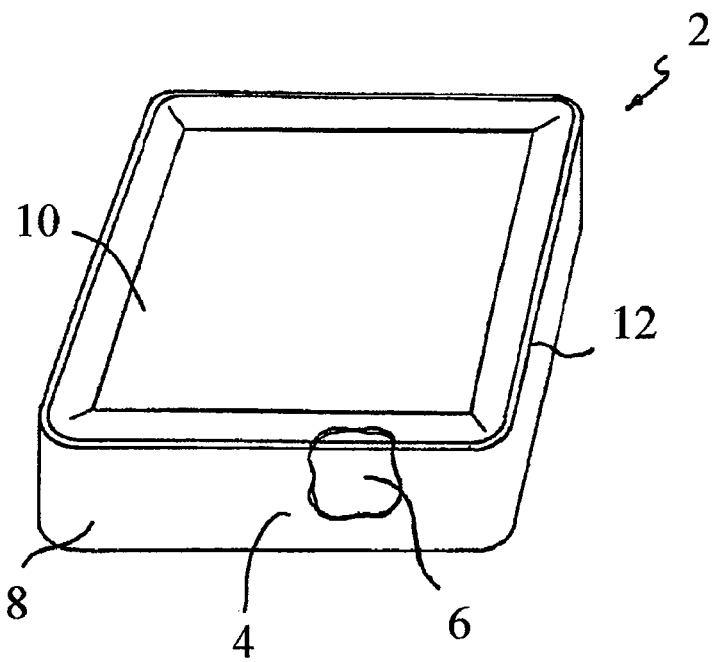
FIG. 1 is a perspective view, with a cutaway section, of a coated cutting tool in accordance with an embodiment of the present invention. In the cutaway section, a portion of the hard coating has been removed to reveal the substrate.

In this section, some preferred embodiments of the present invention are described in detail sufficient for one skilled in the art to practice the present invention. It is to be understood, however, that the fact that a limited number of preferred embodiments are described herein does not in any way limit the scope of the present invention as set forth in the appended claims. Whenever the term "about" is used herein or in the appended claims to modify a feature of an embodiment of the present invention, it is to be construed as referring to the ordinary tolerances related to making and/or measuring the relevant feature. Whenever a range is used herein or in the appended claims to describe a feature of an embodiment of the present invention, the range is to be construed as including the stated end points of the range and every point therebetween.

Preferred embodiments of the present invention include coated cutting tools having hard coatings which comprise at least one aluminum titanium nitride layer having a single phase structure of B1 cubic phase and a composition of $(Al_xTi_{1-x})N$, where x is in the range of about 0.46 to about 0.52 moles, the hard coating having a residual stress in the range of from about −0.4 to about −3 GPa as measured by the $Sin^2 \Psi$ method, and a crystallographic orientation characterized by an X-ray diffraction (200) to (111) peak intensity ratio in the range of about 1 to about 14. For convenience of expression, the material comprising such aluminum titanium nitride layers is sometimes referred to herein as the "inventive aluminum titanium nitride." Preferably the average crystallite size of the inventive aluminum titanium nitride is in the range of from about 15 to about 50 nanometers.

In preferred embodiments of the present invention, the crystallographic orientation of the hard coatings is characterized by an X-ray diffraction (200) to (111) peak ratio in the range of from about 1 to about 10. In even more preferred embodiments, this ratio is in the range of from about 5 to about 10.

The hard coatings of embodiments of the present invention may consist of one or more layers of the inventive aluminum titanium nitride, either alone or in combination with layers of other coating materials. These other coating materials may comprise aluminum titanium nitride layers which have characteristics other than that of the inventive aluminum titanium nitride layers. Examples of other coating materials also include aluminum titanium nitride of composition $(Al_xTi_{1-x})N$, where x is not in the range of 0.46-0.52, such as TiN and $(Al_xTi_{1-x})N$ with x more than 0.52.

The substrates of the coated cutting tools of embodiments of the present invention may have any cutting tool configuration. Preferably, the substrate has the configuration of an end mill, a milling tool, a turning tool, or a drilling tool. The substrates may also comprise any suitable cutting tool material which is compatible with the process or processes used to deposit the hard coating. Examples of some preferred substrate materials include cemented tungsten carbide.

FIG. 1 illustrates a coated cutting tool in the form of a coated cutting insert 2 having a hard coating 4 according to an embodiment of the present invention. A portion of the hard coating 4 is cutaway in FIG. 1 so as to show the underlying substrate 6. The cutting insert 2 has a flank surface 8 and a rake surface 10. The flank surface 8 and the rake surface 10 intersect to form a cutting edge 12 at the juncture thereof. It is to be appreciated that coated cutting tools of the present invention may exhibit geometries that are different from the geometry of the cutting insert 2 shown in FIG. 1. For example, a coated cutting tool according to another embodiment of the present invention may be in the form of any other type of a turning tool, an end mill, or a drilling tool.

Figure 2:
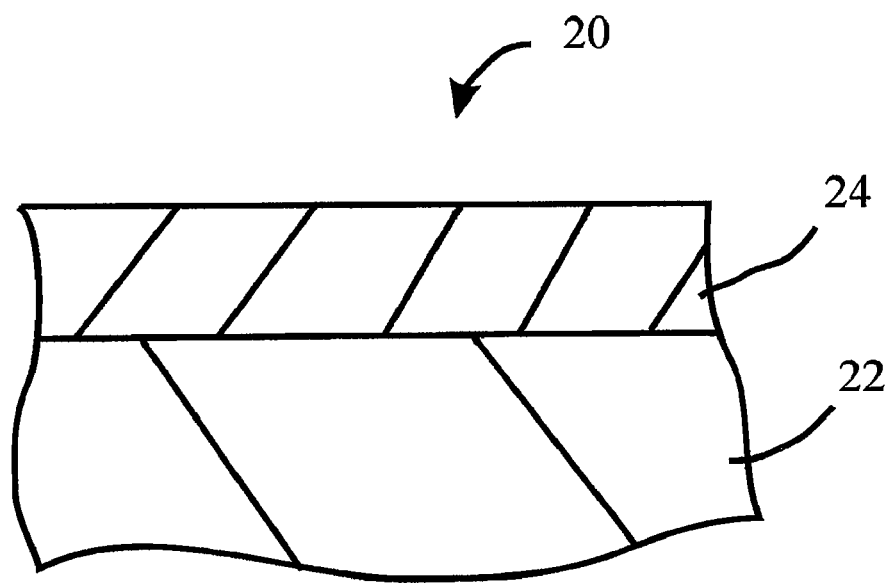
FIG. 2 is a schematic cross-sectional view of a portion of a coated cutting tool having a single layer aluminum titanium nitride coating according to an embodiment of the present invention.
Figure 3:
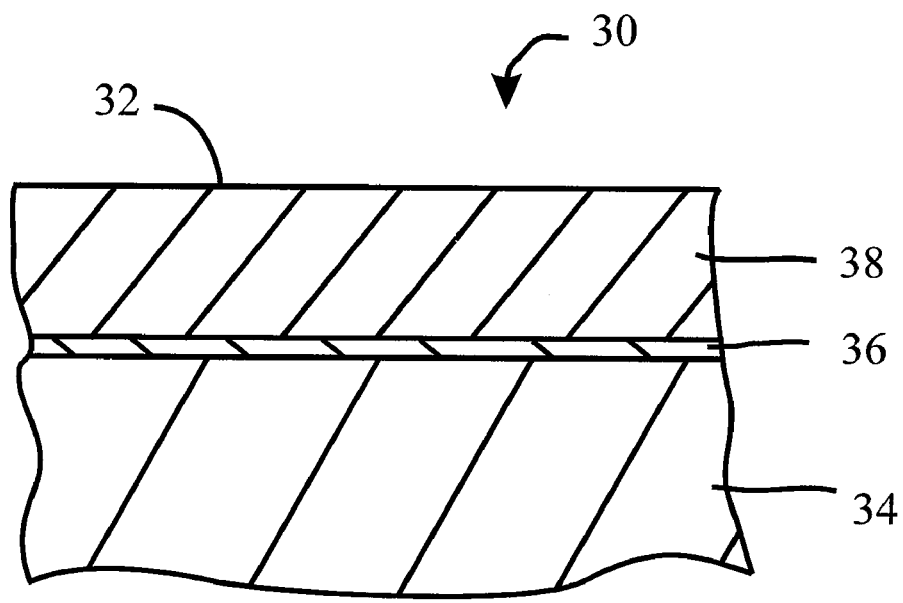
FIG. 3 is a schematic cross-sectional view of a portion of a coated cutting tool having a bonding layer followed by the aluminum titanium nitride coating according to an embodiment of the present invention.
Figure 4:
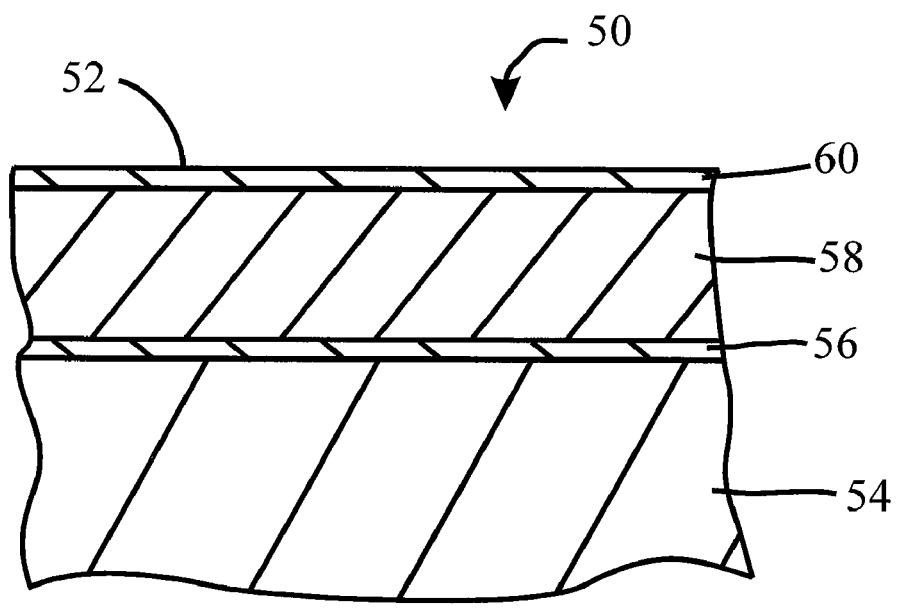
FIG. 4 is a schematic cross-sectional view of a portion of a coated cutting tool having a multilayer hard coating according to another embodiment of the present invention.

FIGS. 2-4 illustrate portions of cross-sections of coated cutting inserts according to embodiments of the present invention at the interface of the hard coating and the substrate. It is to be understood that the representation of the layer thicknesses in these drawings are not to scale and are intended only to show the general spatial relationship of the layers and the substrate. Referring to FIG. 2 there is shown a coated cutting tool 20 having a substrate 22 and a hard coating 24 consisting of a single layer of the inventive aluminum titanium nitride. The hard coating 24 may have any desired thickness, but preferably has a thickness in the range of 1 to 10 microns.

Referring now to FIG. 3, there is shown a coated cutting tool 30 according to an embodiment of the present invention. The coated cutting tool 30 has a hard coating 32 and a substrate 34. The hard coating 32 comprises a titanium nitride bonding layer 36 and a layer 38 of the inventive aluminum titanium nitride.

Referring now to FIG. 4, there is shown a coated cutting tool 50 having a hard coating 52 on a substrate 54 according to another embodiment of the present invention. The hard coating 52 has a titanium nitride bonding layer 56, a layer 58 of the inventive aluminum titanium nitride layer, and top titanium nitride layer 60 which is less than 1.5 μm thick.

The inventive aluminum titanium nitride has a B1 cubic crystal structure and is devoid of hexagonal phase. The absence of hexagonal phase may be determined by x-ray diffraction using the Reitveld method, which is a full pattern fit method. In the Reitveld method, the measured specimen profile is compared with a calculated profile and the variations between the two profiles are minimized by adjusting various parameters. The x-ray diffraction pattern of a coating is collected with a parallel beam optics x-ray diffraction system employing a grazing incidence technique using a 1 degree grazing angle for collection. The x-ray diffraction system uses a copper x-ray tube (operated at 45 KV and 40 MA), a Cu W/Si parabolic mirror with a 1/16 degree anti-scatter slit, a 0.04 radian soller slit, and receiving optics which include a flat graphite monochromator, a parallel plate collimator, and a sealed proportional counter. The coating specimen height is set using x-ray beam splitting and the counting times and scan rate are optimized for Reitveld method analysis. During the analysis, a background profile is fitted and peak search is performed on the collected specimen data to identify all peak positions and peak intensities, which are used to identify the phase composition of the specimen using conventional crystal phase databases.

Those skilled in the art will appreciate that the measured value of residual stress of a hard coating is dependent upon many factors, including the configuration and composition of the substrate upon which the hard coating was deposited and the method which is used to make the measurement. It is important to understand that the residual stress values of the present invention are to be measured when the hard coating is deposited upon a cutting tool substrate and not upon a glass slide. It is also important to understand that the residual stress of the hard coatings of the coated cutting tools of the present invention are measured using the $\text{Sin}^2 \Psi$ method. The data required for the $\text{Sin}^2 \Psi$ stress analysis is collected using the "grazing incidence" XRD technique. The instrument used for this stress analysis is a PANalytical Xpert Pro MRD fitted with a Eulerian cradle for specimen manipulation. The x-ray source is a copper long fine focus x-ray tube operating at 45 KV and 40 MA. The instrument is configured with parallel beam optics for the determination of the stress in the coatings. The incident optics includes a Cu W/Si parabolic x-ray mirror, 1/16 degree antiscatter slit and a 0.04 radian soller slit. The receiving optics include; a 0.27 degree parallel plate collimator, a flat graphite monochromator and a sealed proportional counter. The omega angle (grazing angle) for the stress analysis is fixed at 1.0 degree. Data is collected for the (111), (200), (220), (311), (222), (331), (420) and the (422) reflections. The coating residual stress is calculated from the general equation:

$$\frac{d_{\varphi\psi} - d_0}{d_0} = S_1(\sigma_1 + \sigma_2) + \frac{1}{2}S_2\sigma_\varphi \sin^2\psi$$

where $\sigma_\varphi = \sigma_1 \cos^2\varphi + \sigma_2 \sin^2\varphi$
$d_{\varphi\psi}$=lattice constant at angle $\varphi$ and tilt $\psi$
$d_o$=strain free lattice constant
$\varphi$=rotation angle
$\psi$=specimen tilt
$\sigma_1$ & $\sigma_2$=primary stress tensors in specimen surface
$\sigma_\varphi$=stress at $\varphi$ rotation angle
$S_1$ & $\frac{1}{2}S_2$=X-ray elastic constants[1,2,6]

$$S_1 = \frac{-\upsilon}{E}$$
$$\frac{1}{2}S_2 = \frac{1+\upsilon}{E}$$

For this analysis Poisson's Ratio ($\upsilon$) was set to 0.20 and the elastic modulus (E in GPa) was determined from nano-indentation analysis. Although the residual stress of hard coatings according to the present invention are in the range of from about −0.4 to about −3 GPa, preferably the residual stress is in the range of from about −0.4 to about −2.5 GPa, and more preferably in the range of from about −0.4 to about −1.8 GPa.

The overall thickness of the hard coatings according to the present invention is to be selected with respect to the application to which the coated substrate is to be used, as well as the nature of the substrate and the number of layers making up the hard coating. Preferably, the overall thickness of the hard coatings is in the range of from about 2 to about 10 microns, and more preferably in the range of from about 2 to about 8 microns.

In hard coatings according to the present invention, a layer of the inventive aluminum titanium nitride may have any desired thickness, but preferably the thickness of such a layer is in the range of from about 1 to about 10 microns, and more preferably the thickness is in the range of from about 1 to about 8 microns.

In some embodiments of the present invention, the hard coatings are deposited by the cathode arc process, although other deposition processes may be used, e.g. magnetron sputtering, filtered cathodic arc evaporation. Preferably, the substrate is at a temperature of from about 350° C. to about 600° C. during the deposition of each of the inventive aluminum titanium nitride layers, and more preferably in the range of from about 400° C. to about 550° C. It is also preferred that the substrate biasing voltage for these layers be in the range of from about 20 to about 80V, and more preferred that the biasing voltage be in the range of from about 30 to about 60 V.

EXAMPLES

Example 1

A 5.1 micron thick hard coating according to the present invention comprising a single layer of the inventive aluminum titanium nitride was deposited on a cemented tungsten carbide substrate configured in the form of a square shape using a cathode arc deposition unit having 4 powder metallurgy prepared targets of 55 atomic percent aluminum and 45 atomic percent titanium composition. The substrate was mounted on a double rotation carousel. During the deposition process, the substrate temperature was 450° C. The source power was 6 kilowatts and the atmosphere was nitrogen maintaining a pressure of $5.0 \times 10^{-2}$ millibar. The layer was deposited in 200 minutes using a −40 V biasing voltage. The hard coating composition was measured using a 20 KV JEOL (JSM 6400) scanning electron microscope (SEM) equipped with Oxford INCA energy dispersive spectrometer (EDS) and was determined to be $(Al_{0.47}Ti_{0.53})N$. Thin film x-ray diffraction was used to measure phase constitution. It is conducted on Panalytical X'pert Pro MRD instrument equipped with Eulerian cradle using a grazing incident angle of one degree. It was revealed the hard coating to be single phase consisting of B1 cubic phase. The hard coating was determined by x-ray diffraction Williamson Hall method to have an average crystallite size of 40.4 nanometers. The crystallographic orientation, determined by the peak ratio of the 200 to 111 reflections, of the hard coating was measured by x-ray diffraction with Bragg-Brentano (θ~2θ) configuration. It is conducted on Panalytical X'pert Pro MPD instrument (PANalytical B.V.) using Cu Kα radiation (45 KV, 40 mA). The intensity ratio of the (200) diffraction peak to that of the (111) peak was determined to be 8.1. The hardness of the hard coating was measured using Fischerscope HM2000 (Fischer technology Inc.) according to ISO standard 14577 using a Vickers indenter. Indentation depth was set at 0.25 μm. The average of fifteen measurements is reported. The measured hardness of the hard coating was 30.6 GPa. The residual stress by the $\text{Sin}^2 \Psi$ method was measured to be −0.483 GPa. The measurement data for Example 1 is summarized in Table 1.

Examples 2-4

Coated substrate Examples 2 of the present invention with hard coatings having the compositions given in Table I were made in a fashion similar to that described in Example 1 except for the following difference. The bias of −40V and −30V was applied to the substrate in an alternating fashion with 9.7 mins for −40V and 4.8 mins for −30V. Total of ten alternation was applied, followed by ending the coating deposition with 14.5 mins of −40V bias. The total deposition time is 159.5 mins. Also Example 1 used a nitrogen pressure of $5.0 \times 10^{-2}$ millibar. Example 3 and 4 were made in a similar fashion with Example 1 except that example 3 and 4 used a nitrogen pressure of $3.2 \times 10^{-2}$ millibar. The composition, crystal structure, crystallite size, hardness, residual stress, and x-ray diffraction I(200)/I(111) orientation ratio for the hard coating of each coated substrate, as measured by methods identified in Example 1, are also given in Table 1. All examples are characterized by 100% cubic phase, relatively high hardness (>29GPa), and lower compressive stress (<−2GPa).

Comparative Samples

Coated substrates, which are identified in Table 1 as Comparative 1-3, having conventional aluminum titanium nitride coatings were made and evaluated in a similar fashion to that described in Example 1. The properties of the hard coatings of these coated substrates are summarized in Table 1. Comparative 1, which has lower aluminum content than the present patent, has lower hardness although it has 100% cubic phase and lower stress. And comparative 2 and 3, which have higher aluminum content than the present patent, have relatively higher stresses. The hardness of comparative is also degraded with high amount of hexagonal phases present.

TABLE 1

| Sample ID | x Value for $(Al_xTi_{1-x})N$ | Phases | Hex. Phase (wt. %) | Crystallite Size (nm) | Hardness (GPa) | Residual Stress (GPa) | I(200)/I(111) Ratio |
|---|---|---|---|---|---|---|---|
| Example 1 | 0.47 | B1 cubic | 0 | 40.4 | 30.6 | −0.483 | 8.1 |
| Example 2 | 0.48 | B1 cubic | 0 | 44.4 | 29.2 | −1.186 | 9.4 |
| Example 3 | 0.49 | B1 cubic | 0 | 37.9 | 30.3 | −1.531 | 9.9 |
| Example 4 | 0.51 | B1 cubic | 0 | 23.2 | 31.5 | −1.858 | 3.9 |
| Comp. 1 | 0.45 | B1 cubic | 0 | 24.2 | 28.7 | −1.408 | 7.9 |
| Comp. 2 | 0.53 | B1 cubic + hex. | 0.6 | 17.7 | 31.3 | −4.834 | 3.7 |
| Comp. 3 | 0.53 | B1 cubic + hex. | 16.8 | 14.9 | 28.2 | −2.785 | 1.3 |

A drill test was conducted to evaluate an embodiment of a coating of the present invention. All examples and comparative 1 have similar coating thickness about 5 microns. The substrates were mounted in a triple-rotation carousel. The substrates were WC-10 wt % Co grade cemented tungsten carbide in the form of 0.33 inch diameter drills. The cutting material is 4140 steels. The testing conditions and results are summarized in Table 2. The results show that the coatings of the present invention performed surprisingly better than the comparative sample.

TABLE 2

| Sample ID | x Value for $(Al_xTi_{1-x})N$ | Surface Speed (feet/min) | Feed Rate (inches per revolution) | Depth of hole (inches) | Coolant | Number of holes made |
|---|---|---|---|---|---|---|
| Example 1 | 0.47 | 590 | 0.008 | 1.85 | Flood | 1058 |
| Example 2 | 0.48 | 590 | 0.008 | 1.85 | Flood | 1161 |
| Example 3 | 0.49 | 590 | 0.008 | 1.85 | Flood | 1405 |
| Comp. 1 | 0.45 | 590 | 0.008 | 1.85 | Flood | 842 |

While only a few embodiments of the present invention have been shown and described, it will be obvious to those skilled in the art that many changes and modifications may be made thereunto without departing from the spirit and scope of the present invention as described in the following claims. All patent applications and patents, both foreign and domestic, and all other publications referenced herein are incorporated herein in their entireties to the full extent permitted by law.

What is claimed is:

1. A coated cutting tool comprising:
a substrate having a cutting tool configuration; and
a hard coating comprising at least one aluminum titanium nitride layer having a single phase structure of B1 cubic phase and a composition of $(Al_xTi_{1-x})N$, where x is in the range of about 0.46 to about 0.52 moles, the hard coating further having a residual stress in the range of from about −0.4 to about −3 GPa as measured by the XRD $\mathrm{Sin}^2 \Psi$ method and a crystallographic orientation characterized by an x-ray diffraction (200) to (111) peak intensity ratio in the range of about 1 to about 14 and an average crystallite size of the aluminum titanium nitride layer in the range of about 15 to about 50 nanometers.

2. The coated cutting tool of claim 1, wherein the substrate comprises cemented tungsten carbide.

3. The coating cutting tool of claim 1, wherein the configuration of the substrate is one selected from the group consisting of an end mill, a milling tool, a turning tool, and a drilling tool.

4. The coated cutting tool of claim 1, wherein the residual stress of the hard coating is in the range of from about −0.4 to about −2.5 GPa.

5. The coated cutting tool of claim 1, wherein the residual stress of the hard coating is in the range of from about −0.4 to about −1.8 GPa.

6. The coated cutting tool of claim 1, wherein the (200) to (111) peak intensity ratio ranges from about 5 to about 10.

7. The coated cutting tool of claim 1, wherein the aluminum titanium nitride layer has a thickness of 1 to 10 microns.

8. The coated cutting tool of claim 1, wherein the hard coating has a hardness greater than 29 GPa.

9. The coated cutting tool of claim 1, wherein the hard coating has a hardness ranging from 29 GPa to 31.5 GPa.

10. The coated cutting tool of claim 1 further comprising a titanium nitride bonding layer between the substrate and the aluminum titanium nitride layer.

11. The coated cutting tool of claim 10 further comprising a titanium nitride layer over the aluminum titanium nitride layer.

12. The coated cutting tool of claim 1 further comprising a titanium nitride layer over the aluminum titanium nitride layer.

13. A coated cutting tool comprising:

a substrate having a cutting tool configuration; and a hard coating comprising at least one aluminum titanium nitride layer having a single phase structure of B1 cubic phase and a composition of $(Al_xTi_{1-x})N$, where x is in the range of about 0.46 to about 0.52 moles and a titanium nitride bonding layer between the substrate and the aluminum titanium nitride layer, the hard coating further having a residual stress in the range from about −0.4 to about −3 GPa as measured by the XRD $Sin^2 \Psi$ method and a crystallographic orientation characterized by an x-ray diffraction (200) to (111) peak intensity ratio in the range of about 5 to about 10 and an average crystallite size of the aluminum titanium nitride layer in the range of about 15 to about 50 nanometers.

14. The coated cutting tool of claim 13, wherein the residual stress of the hard coating is in the range of from about −0.4 to a about −2.5 GPa.

15. The coated cutting tool of claim 13, wherein the residual stress of the hard coating is in the range of from about −0.4 to a about −1.8 GPa.

16. The coated cutting tool of claim 13, wherein the substrate comprises cemented tungsten carbide.

17. The coated cutting tool of claim 13 further comprising a titanium nitride layer over the aluminum titanium nitride layer.

18. The coated cutting tool of claim 13, wherein the aluminum titanium nitride layer has a thickness of 1 to 10 microns.

19. The coated cutting tool of claim 13, wherein the hard coating has a hardness greater than 29 GPa.

20. The coated cutting tool of claim 13, wherein the hard coating has a hardness ranging from 29 GPa to 31.5 GPa.

* * * * *